(12) United States Patent   (10) Patent No.: US 8,196,078 B2
Chen et al.                 (45) Date of Patent:    Jun. 5, 2012

(54) METHOD FOR PREDICTING AND DEBUGGING EMI CHARACTERISTICS IN IC SYSTEM AND RELATED MACHINE-READABLE MEDIUM

(75) Inventors: Tung-Yang Chen, Tainan County (TW);
Ching-Ling Tsai, Tainan County (TW);
Sheng-Fan Yang, Tainan County (TW);
Jui-Ni Lee, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 275 days.

(21) Appl. No.: 12/703,770

(22) Filed: Feb. 11, 2010

(65) Prior Publication Data
US 2010/0235798 A1    Sep. 16, 2010

Related U.S. Application Data

(60) Provisional application No. 61/159,798, filed on Mar. 12, 2009.

(51) Int. Cl.
*G06F 17/50* (2006.01)
*G06F 11/22* (2006.01)

(52) U.S. Cl. .................................. 716/108; 716/136

(58) Field of Classification Search .............. 716/108, 716/136
See application file for complete search history.

(56) References Cited

U.S. PATENT DOCUMENTS

| 5,767,789 A * | 6/1998 | Afzali-Ardakani et al. . 340/10.1 |
| 2006/0043979 A1 * | 3/2006 | Wu ................... 324/627 |
| 2007/0079272 A1 * | 4/2007 | Maekawa et al. ............... 716/6 |
| 2007/0288873 A1 * | 12/2007 | Kobayashi et al. ............ 716/5 |
| 2010/0006987 A1 * | 1/2010 | Murugan et al. ............ 257/659 |
| 2010/0138800 A1 * | 6/2010 | Kobayashi .................... 716/5 |
| 2011/0112784 A1 * | 5/2011 | Nikitin ......................... 702/70 |

* cited by examiner

*Primary Examiner* — Thuan Do
*Assistant Examiner* — Magid Dimyan
(74) *Attorney, Agent, or Firm* — Winston Hsu; Scott Margo (57) ABSTRACT

A method for predicting and debugging electromagnetic interference (EMI) characteristics of an integrated circuit (IC) system includes the following steps: selecting a frequency domain range according to transformed raw data of the IC system to generate a blocking frequency analysis result, wherein the transformed raw data are transformed by a time-frequency waveform transformation; setting criteria data; comparing the blocking frequency analysis result with the criteria data to generate at least one comparison result; and generating a pass analysis report when a processing unit determines that each comparison result is passed; otherwise, executing an EMI design time-frequency analysis.

22 Claims, 7 Drawing Sheets

METHOD FOR PREDICTING AND DEBUGGING EMI CHARACTERISTICS IN IC SYSTEM AND RELATED MACHINE-READABLE MEDIUM

CROSS REFERENCE TO RELATED APPLICATIONS

This application claims the benefit of U.S. provisional application No. 61/159,798, filed on Mar. 12, 2009 and incorporated herein by reference.

BACKGROUND OF THE INVENTION

1. Field of the Invention

The present invention relates to an integrated circuit (IC) system, and more particularly, to a method for predicting and debugging electromagnetic interference (EMI) characteristics of an IC system, and a related machine-readable medium.

2. Description of the Prior Art

In recent years, the electronic information industry has bloomed, with the result that various applications of electronic information products are becoming more and more popular. Since the size of electronic information products is becoming smaller and smaller, an intermittent or continuous voltage of the internal system is subject to rapid changes, thereby producing a great deal of noise that seriously affects the functions of each device. Such a phenomenon is called electromagnetic interference (EMI). EMI generally enters or exits a circuit via two ways: radiation and conduction, wherein radiation is leaked from a gap, groove, or other opening of the device casing, and conduction is transmitted to a power supply, signal, or control line to generate interference. Therefore, an important research and development subject in the industry is how to suppress or cancel electromagnetic interference and ensure that electronic and electric products can be operated in an appropriate electromagnetic environment.

A printed circuit board (PCB), or an integrated circuit (IC), is a support for circuit elements of an electronic product, and provides electrical connections between the circuit elements. With the current trends of electronic products toward high frequency and small size, the density of circuit elements on the PCB/IC becomes higher and higher, and thus issues of EMI and electromagnetic compatibility (EMC) among the circuit elements also become increasingly important. Therefore, the design of the PCB/IC affects the anti-interference ability of the electronic device. Even if the circuit design is correct, if the layout of the PCB/IC is designed inappropriately, the performance and the reliability of the electronic product could also be adversely affected.

Frequencies are continuously increasing, while integration trends are squeezing entire systems into extraordinarily high circuit densities. EMI and signal couplings caused by EMI have therefore become crucial issues in the design of modern system-on-a-chip (SoC) systems. There is a need in this industry, regarding both the cost aspect and the aspect of the time-to-market of products, to provide a solution so that the EMI problems can be addressed or eliminated as early as possible during the design phase.

SUMMARY OF THE INVENTION

It is therefore one of the objectives of the present invention to provide a method for predicting and debugging electromagnetic interference (EMI) characteristics of an IC system, and a related machine-readable medium, to solve the above mentioned problems.

According to an embodiment of the present invention, an exemplary method for predicting and debugging EMI characteristics of an IC system is disclosed. The exemplary method includes the following steps: selecting a frequency domain range according to transformed raw data of the IC system to generate a blocking frequency analysis result, wherein the transformed raw data are transformed by a time-frequency waveform transformation; setting criteria data; comparing the blocking frequency analysis result with the criteria data to generate at least one comparison result; and generating a pass analysis report when a processing unit determines that each comparison result is passed; otherwise, executing an EMI design time-frequency analysis.

According to another embodiment of the present invention, an exemplary machine-readable medium is provided. The exemplary machine-readable medium stores instructions which, when executed by a processor, cause the processor to perform the following steps: selecting a frequency domain range according to transformed raw data of the IC system to generate a blocking frequency analysis result, wherein the transformed raw data are transformed by a time-frequency waveform transformation; setting criteria data; comparing the blocking frequency analysis result with the criteria data to generate at least one comparison result; and generating a pass analysis report when a processing unit determines that each comparison result is passed; otherwise, executing an EMI design time-frequency analysis.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
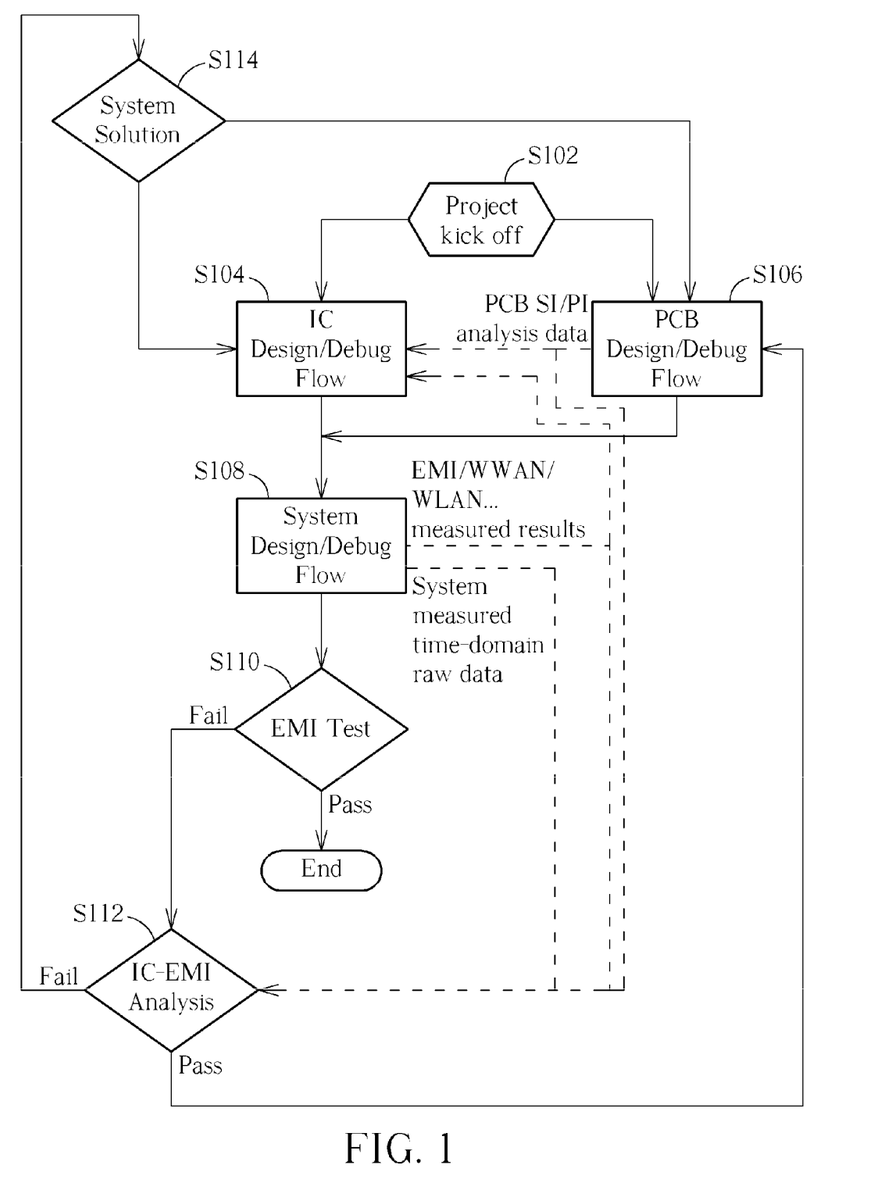
FIG. 1 is a flowchart illustrating a method for predicting and debugging electromagnetic interference (EMI) characteristics of an integrated circuit (IC) system according to an exemplary embodiment of the present invention.

Please refer to FIG. 1. FIG. 1 is a flowchart illustrating a method for predicting and debugging electromagnetic interference (EMI) characteristics of an integrated circuit (IC) system according to an exemplary embodiment of the present invention, wherein the IC system includes at least an integrated circuit (IC) and a printed circuit board (PCB). The method includes, but is not limited to, the following steps. In step 102, a project is kicked off. The flow proceeds with steps 104 and 106. A design/debug operation is performed upon an IC in step 104, and then the flow goes to step 108. A design/debug operation is performed upon a PCB to generate PCB signal integrity/power integrity (SI/PI) analysis data in step 106, and then the flow goes to step 108. In step 108, a measure/debug operation is performed upon the IC system to generate EMI, WWAN, WLAN, . . . , measured results and system measured time-domain raw data. Next, the flow goes to step 110 to perform an EMI test operation upon the IC system. If the IC system does not pass the EMI test, the flow goes to step 112; otherwise, the project is ended. In step 112, the PCB SI/PI analysis data, the EMI, WWAN, WLAN, . . . , measured results and the system measured time-domain raw data are received and an IC-EMI analysis is executed upon the IC according to the PCB SI/PI analysis data, the EMI, WWAN, WLAN, . . . , measured results and the system measured time-domain raw data. If the IC passes the IC EMI analysis, the flow goes back to step 106; otherwise, the flow goes to step 114. In step 114, the flow will go to step 104 or step 106 according to the design suggestion reports of the IC system/the client requirements.

Figure 2:
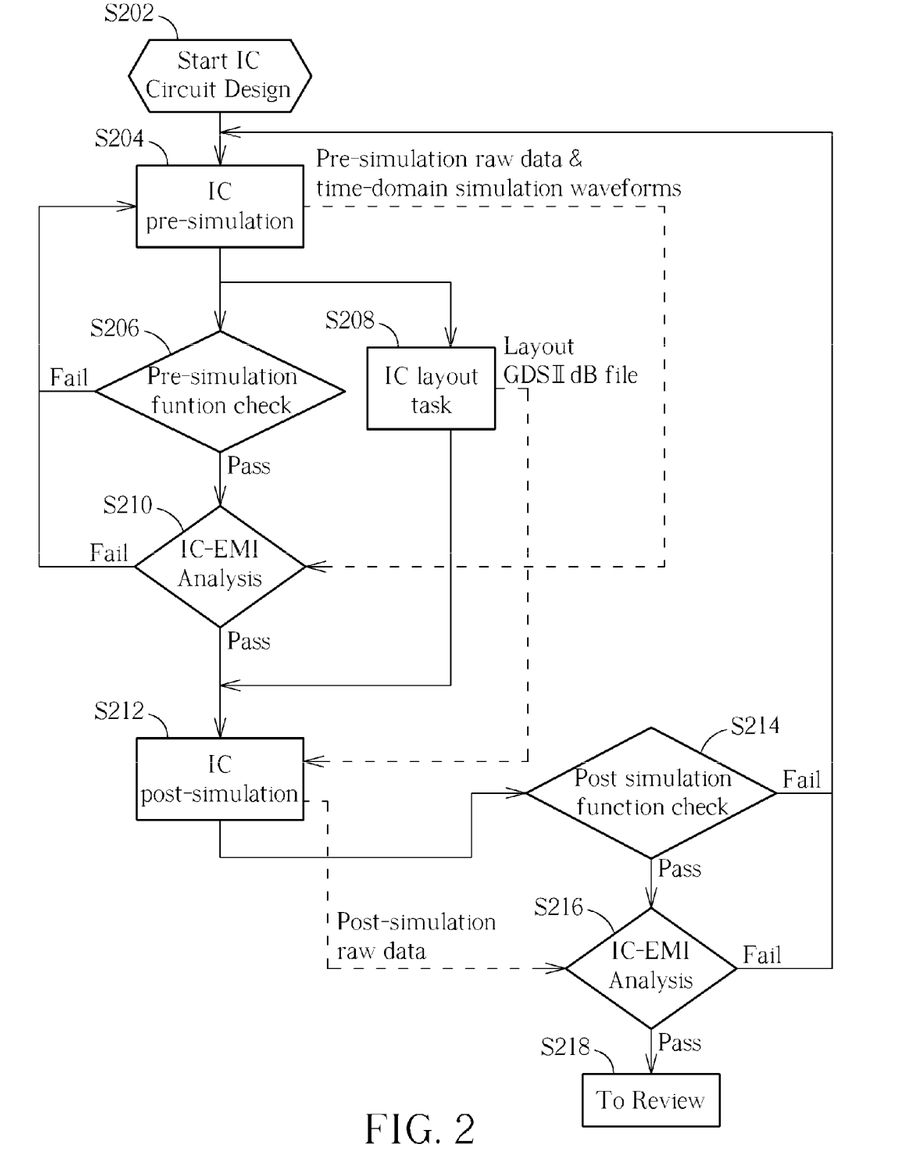
FIG. 2 is a flowchart illustrating a method for performing the design/debug operation upon an IC according to an exemplary embodiment of the present invention.

Please refer to FIG. 2. FIG. 2 is a flowchart illustrating a method for performing the design/debug operation upon an IC according to an exemplary embodiment of the present invention. More specifically, FIG. 2 is a detailed flow of the step 104 shown in FIG. 1. The method includes, but is not limited to, the following steps. In step 202, an IC circuit design is started. A pre-simulation is performed upon the IC to generate pre-simulation raw data and time-domain simulation waveforms in step 204, and then the flow goes to step 206 and step 208. In step 206, a pre-simulation function check is performed upon the IC to check if the functionality of the IC is available. If yes, the flow goes to step 210; otherwise, the flow goes back to step 204. In step 208, an IC layout task is performed, and layout graphic data system (GDS) II dB file is generated accordingly. Next, the flow goes to step 212.

In step 210, the pre-simulation raw data derived in step 204 is received, and an IC-EMI analysis is executed upon the IC according to the received pre-simulation raw data. If the IC passes the IC EMI analysis, the flow goes to step 212; otherwise, the flow goes back to step 204. In step 212, a post-simulation is performed upon the IC to generate post-simulation raw data according to the layout GDS II dB file. Next, the flow proceeds with step 214 to perform a post-simulation function check upon the IC to check if the functionality of the IC is available. If yes, the flow goes to step 216; otherwise, the flow goes back to step 204. In step 216, the post-simulation raw data derived from step 212 is received, and an IC EMI analysis is executed upon the IC according to the received post-simulation raw data. If the IC passes the IC EMI analysis, the flow goes to step 218; otherwise, the flow goes back to step 204. When the IC passes the IC EMI analysis in step 216, step 218 is executed to perform a tape out (TO) review to generate TO information.

Figure 3:
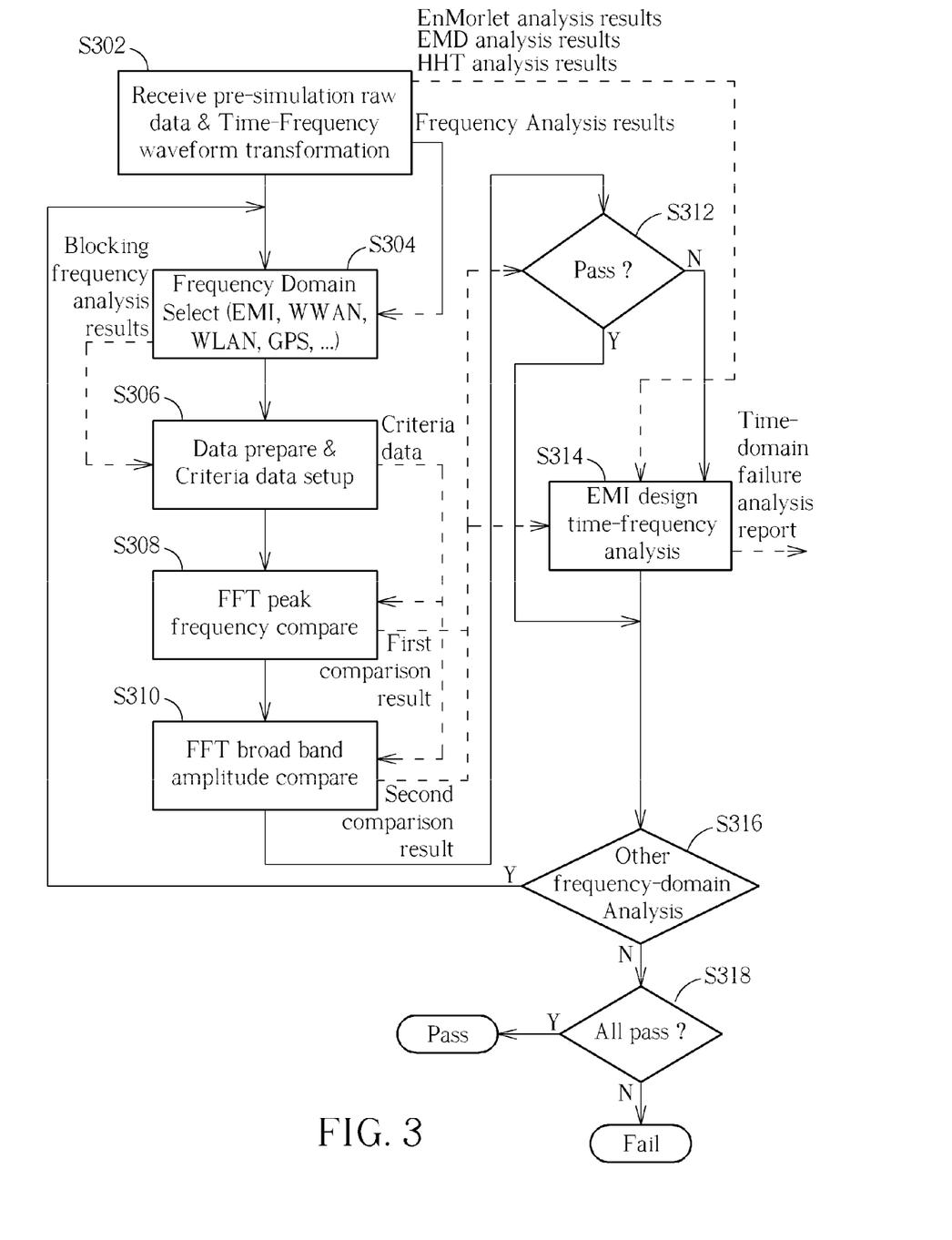
FIG. 3 is a flowchart illustrating a method for predicting and debugging EMI characteristics of an IC according to an exemplary embodiment of the present invention.

Please refer to FIG. 3. FIG. 3 is a flowchart illustrating a method for predicting and debugging EMI characteristics of an IC according to an exemplary embodiment of the present invention. More specifically, FIG. 3 shows a detailed flow of the step 210 shown in FIG. 2. The method includes, but is not limited to, the following steps. In step 302, the pre-simulation raw data is received, and a time-frequency waveform transformation is performed upon the pre-simulation raw data to generate transformed pre-simulation raw data, wherein the transformed pre-simulation raw data includes, but is not limited to, frequency analysis results, EnMorlet analysis results, Empirical Mode Decomposition (EMD) analysis results and Hilbert-Huang Transformation (HHT) analysis results. Step 304 selects a frequency domain range (e.g. EMI 30M-300M, EMI 300M-1 G, GSM 850, GSM 900, WCDMA, WLAN, GPS) of the transformed pre-simulation raw data to generate blocking frequency analysis results. Step 306 integrates the information of IC-EMI and PCB and sets up a set of criteria data to determine whether the IC passes the IC EMI analysis or not. In step 308, the peak frequency of the blocking frequency analysis results is compared with the peak frequency of the criteria data transformed by the Fast Fourier Transform (FFT) to generate a first comparison result. In step 310, the broad band amplitude of the blocking frequency analysis results is compared with the broad band amplitude of the criteria data transformed by the Fast Fourier Transform (FFT) to generate a second comparison result. In step 312, if a processing unit determines that the first and second comparison results are all passed, a pass analysis report is generated and the flow goes to step 316; otherwise, the flow goes to step 314. In step 314, the transformed pre-simulation raw data is received, and an EMI design time-frequency analysis is executed to generate a time-domain failure analysis report. Step 316 determines if the IC has other frequency domains that still need to be analyzed. If yes, the flow goes to step 304; otherwise, the flow goes to step 318. If all of the selected frequency domains are found passed in step 318, the IC passes the IC-EMI analysis; otherwise, the IC fails to pass the IC-EMI analysis.

Figure 4:
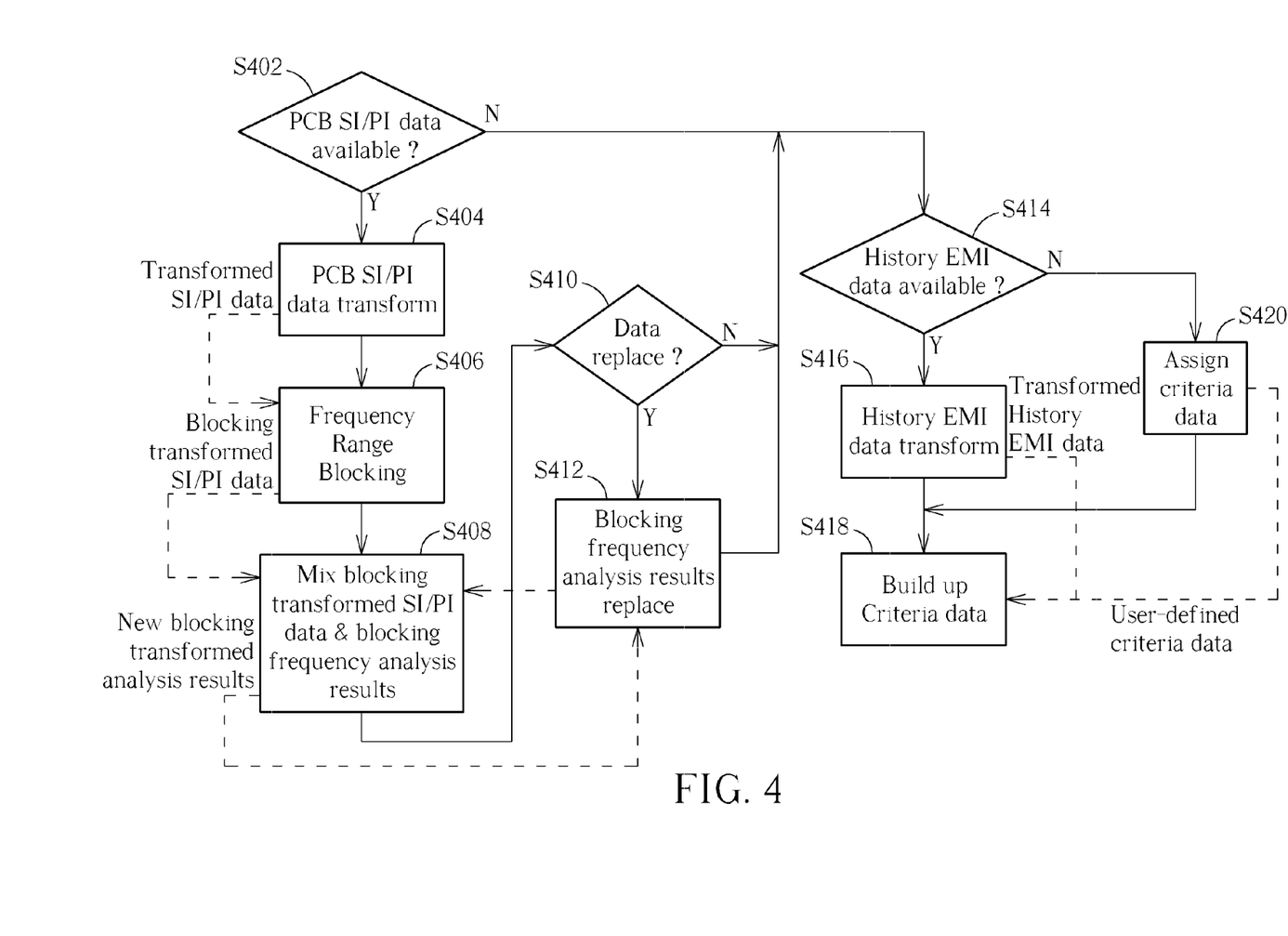
FIG. 4 is a flowchart illustrating a method for setting up the set of criteria data shown in FIG. 3.

Please refer to FIG. 4. FIG. 4 is a flowchart illustrating a method for setting up the set of criteria data shown in FIG. 3. More specifically, FIG. 4 shows a detailed flow of the step 306 shown in FIG. 3. The method includes, but is not limited to, the following steps. Step 402 determines if any PCB SI/PI frequency analysis data of the IC system are available. If yes, the flow goes to step 404; otherwise, the flow goes to step 414. In step 404, the PCB SI/PI frequency analysis data are transformed to thereby form transformed SI/PI data which can be correctly received and processed by a system (e.g., a processor executing instructions stored in a machine-readable medium to realize the exemplary methods of the present invention). Step 406 sets the frequency domain range of the transformed SI/PI data to generate blocking transformed SI/PI data. In step 408, the blocking transformed SI/PI data and blocking frequency analysis results are mixed to generate new blocking frequency analysis results. Step 410 determines if the blocking frequency analysis results should be replaced by the new blocking frequency analysis results. If yes, the flow goes to step 412; otherwise, the flow goes to step 414. In step 412, the blocking frequency analysis results are replaced by the new blocking frequency analysis results. Step 414 determines if any history EMI data of the IC system are available, wherein the history EMI data include EMI, WWAN, WLAN, . . . , measured results as shown in FIG. 1. If yes, the flow goes to step 416; otherwise, the flow goes to step 420. In step 416, the history EMI data are transformed to thereby form transformed history EMI data. Step 418 builds up the criteria data according to the transformed history EMI data obtained in step 416. Step 420 builds up the criteria data by utilizing a user-defined criteria data.

Figure 5:
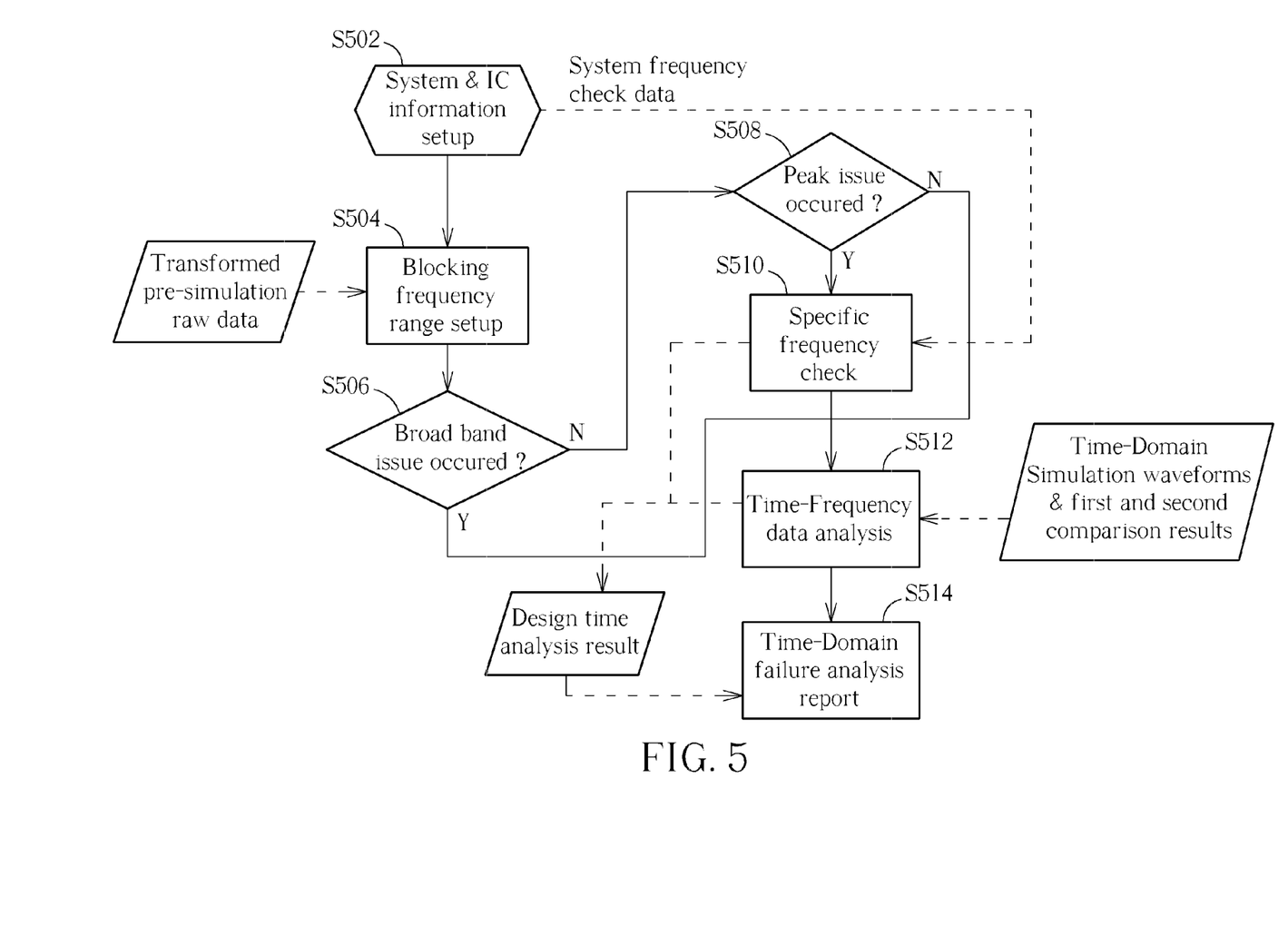
FIG. 5 is a flowchart illustrating a method for executing the EMI design time-frequency analysis shown in FIG. 3.

Please refer to FIG. 5. FIG. 5 is a flowchart illustrating a method for executing the EMI design time-frequency analysis shown in FIG. 3. More specifically, FIG. 5 shows a detailed flow of the step 314 shown in FIG. 3. The method includes, but is not limited to, the following steps. Step 502 sets system information and IC information to generate system frequency check data. In step 504, the transformed pre-simulation raw data of the IC are received, and a frequency domain range of the transformed pre-simulation raw data is set. Step 506 checks if a broad band issue occurred in the IC system according to the first and second comparison results mentioned above. If yes, the flow goes to step 512; otherwise, the flow goes to step 508. Step 508 checks if a peak issue occurred in the IC system according to the first and second comparison results. If yes, the flow goes to step 510; otherwise, the flow goes to step 512. Step 510 checks if a specific frequency (e.g. a Harmonic frequency) issue occurred in the IC system. If yes, information of the specific frequency is recorded in a design time analysis result. Step 512 integrates time-domain simulation waveforms generated by performing a pre-simulation upon the IC, the first comparison result and the second comparison result to generate integrated simulation data; executes a time-frequency data analysis to generate a time-frequency data analysis result according to the integrated simulation data; and records the time-frequency data analysis result in the design time analysis result. In step 514, a time-domain failure analysis report is generated according to the design time analysis result.

Figure 6:
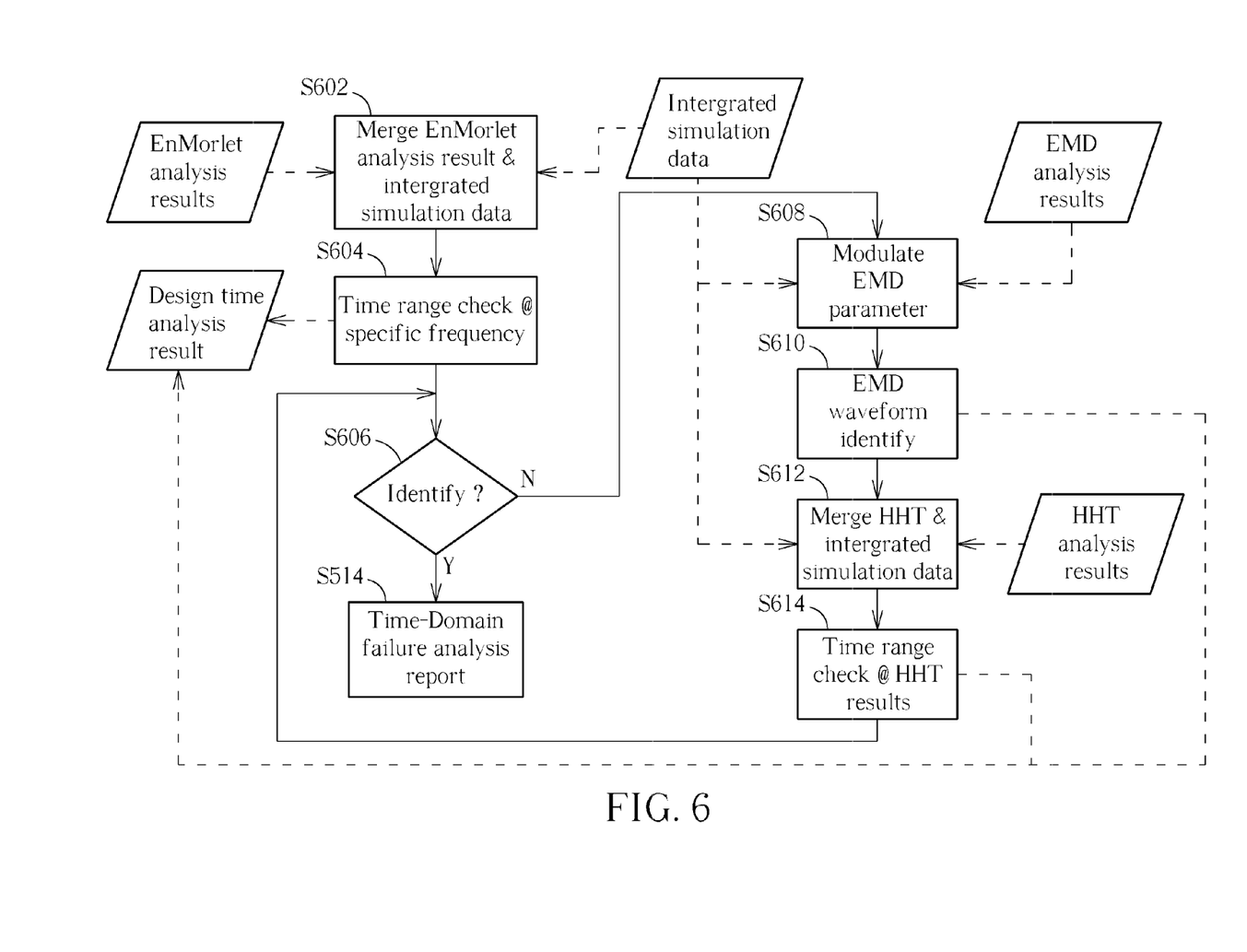
FIG. 6 is a flowchart illustrating a method for executing the time-frequency data analysis shown in FIG. 5.

Please refer to FIG. 6. FIG. 6 is a flowchart illustrating a method for executing the time-frequency data analysis shown in FIG. 5. More specifically, FIG. 6 shows a detailed flow of the step 512 shown in FIG. 5. The method includes, but is not limited to, the following steps. In step 602, the integrated simulation data and the EnMorlet analysis results are merged to generate EnMorlet merged simulation data. Step 604 compares the first and second comparison results to determine a specific frequency, and checks an occurrence time range of the specific frequency according to the EnMorlet merged simulation data and records this in the design time analysis result. Step 606 determines if the EMI characteristics are identified in the design time analysis result. If the EMI characteristics are not identified in the design time analysis result, the flow goes to step 608 to merge the integrated simulation data and the EMD analysis results to generate EMD merged simulation data. Next, step 610 determines if the EMD waveform is identified in the EMD merged simulation data and checks an occurrence time range of the specific frequency according to the EMD merged simulation data, and then recorded in the design time analysis result. Step 612 merges the integrated simulation data and the HHT analysis results to generate HHT merged simulation data. Step 614 checks an occurrence time range of the specific frequency according to the HHT merged simulation data and records this in the design time analysis result, and then the flow goes back to step 606.

In step 604, 608 and 614, the specific frequency is determined by comparing the first and second comparison results, and the occurrence time range of the specific frequency is also checked according to the EnMorlet merged simulation data, the EMD merged simulation data and the HHT merged simulation data, therefore, an abnormal circuit operated at the time range in the specific frequency with the EMI characteristics can be identified.

The steps of the flowchart mentioned above are merely a practicable embodiment of the present invention, and should not be taken as a limitation of the present invention. The method can include other intermediate steps or can merge several steps into a single step without departing from the spirit of the present invention.

Figure 7:
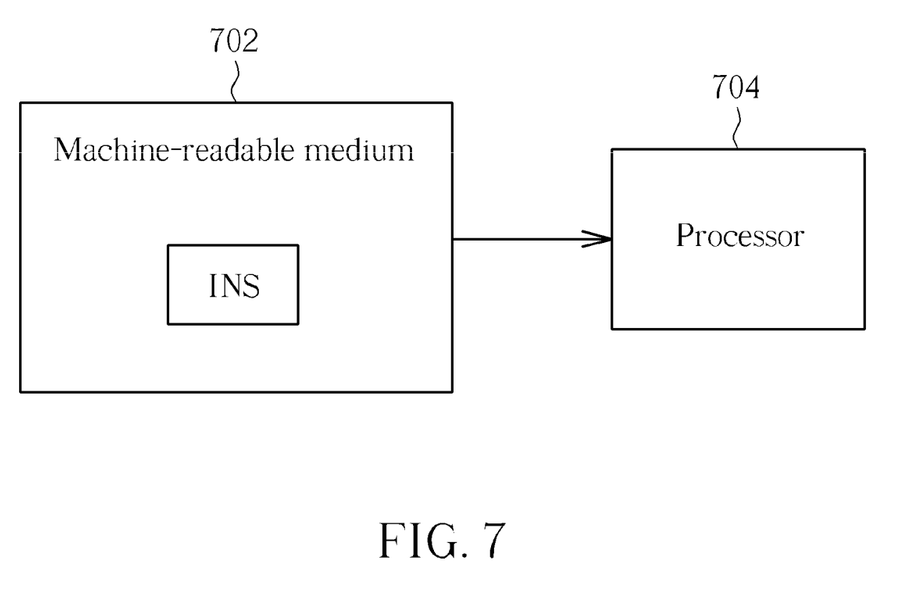
FIG. 7 is a diagram illustrating a machine-readable medium storing instructions which, when executed by a processor, can cause the processor to perform the exemplary methods and steps of the present invention.

Please note that, in another embodiment of the present invention as shown in FIG. 7, a machine-readable medium 702 stores instructions INS which, when executed by a processor 704, can cause the processor to perform the above-mentioned methods and steps. How the processor operates can be readily known by collocating the steps shown in FIG. 1 though FIG. 6. As the descriptions of the steps shown in FIG. 1 though FIG. 6 have already been detailed in above paragraphs, further description is omitted here for brevity.

The abovementioned embodiments are presented merely for describing the present invention, and in no way should be considered to be limitations of the scope of the present invention. In summary, the present invention provides a method for predicting and debugging EMI characteristics of an IC system. By executing the EMI design time-frequency analysis and the time-frequency data analysis repeatedly, the EMI characteristics of the IC system can be identified. Therefore, the EMI problems can be addressed or eliminated as early as possible during the design procedure and the performance and the reliability of the IC system will not be adversely affected by EMI.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for predicting and debugging electromagnetic interference (EMI) characteristics of an integrated circuit (IC) system, comprising:
   selecting a frequency domain range for a processing unit according to transformed raw data of the IC system to generate a blocking frequency analysis result, wherein the transformed raw data are transformed by a time-frequency waveform transformation;
   setting criteria data to the processing unit;
   utilizing the processing unit to compare the blocking frequency analysis result with the criteria data to generate at least one comparison result, the step of wherein the step of comparing the blocking frequency analysis result with the criteria data comprises:
      the step of comparing the blocking frequency analysis result with the criteria data comprises:
      comparing a peak frequency of the blocking frequency analysis result with the criteria data to generate a first comparison result; and
      comparing a broad band amplitude of the blocking frequency analysis result with the criteria data to generate a second comparison result; and
      the pass analysis report is generated when the processing unit determines that the first comparison result and the second comparison result are passed; and
   utilizing the processing unit to generate a pass analysis report when the processing unit determines that each comparison result is passed; otherwise, utilizing the processing unit to execute an EMI design time-frequency analysis.

2. The method of claim 1, wherein the step of executing the EMI design time-frequency analysis comprises:
   determining if a broad band issue occurs in the IC system according to the first and second comparison results.

3. The method of claim 2, wherein the step of determining if the broad band issue occurs in the IC system according to the first and second comparison results comprises:
   when the broad band issue has not occurred in the IC system, determining if a peak issue occurs in the IC system according to the first and second comparison results; and
   when the broad band issue has occurred in the IC system, performing a time-frequency data analysis step for integrating the first and second comparison results and time-domain simulation waveforms of the IC system to generate integrated simulation data, and referring to the integrated simulation data to execute a time-frequency data analysis for generating a design time analysis result.

4. The method of claim 3, wherein the step of determining if the peak issue occurs in the IC system according to the first and second comparison results comprises:

when the peak issue has occurred in the IC system, checking if a specific frequency issue occurs in the IC system, and performing the time-frequency data analysis step; and when the peak issue has not occurred in the IC system, performing the time-frequency data analysis step.

5. The method of claim 1, wherein the step of executing the EMI design time-frequency analysis comprises:

integrating the first and second comparison results and time-domain simulation waveforms of the IC system to generate integrated simulation data, and referring to the integrated simulation data to execute a time-frequency data analysis for generating a design time analysis result.

6. The method of claim 5, wherein the step of referring to the integrated simulation data to execute the time-frequency data analysis comprises:

generating merged simulation data according to the integrated simulation data and the transformed raw data of the IC system;

comparing the first and second comparison results to determine a specific frequency;

checking an occurrence time range of the specific frequency according to the merged simulation data and recording it in the design time analysis result; and determining if the EMI characteristics are identified in the design time analysis result.

7. The method of claim 1, further comprising:

when printed circuit board (PCB) signal integrity/power integrity (SI/PI) frequency analysis data of the IC system are not available, keeping the blocking frequency analysis result intact; and when the PCB SI/PI frequency analysis data of the IC system are available, selectively adjusting the blocking frequency analysis result according to the PCB SI/PI frequency analysis data of the IC system.

8. The method of claim 7, wherein the step of selectively adjusting the blocking frequency analysis result comprises:

transforming the PCB SI/PI frequency analysis data into transformed SI/PI data;

selecting the frequency domain range of the transformed SI/PI data to generate blocking transformed SI/PI data;

mixing the blocking transformed SI/PI data and the blocking frequency analysis result to generate a new blocking frequency analysis result; and selectively replacing the blocking frequency analysis result according to the new blocking frequency analysis result.

9. The method of claim 1, wherein the step of setting the criteria data comprises:

transforming a history EMI data to build up the criteria data when the history EMI data of the IC system are available; otherwise, utilizing a user-defined criteria data.

10. A non-transitory machine-readable medium storing instructions which, when executed by a processor, cause the processor to perform:

selecting a frequency domain range according to transformed raw data of the IC system to generate a blocking frequency analysis result, wherein the transformed raw data are transformed by a time-frequency waveform transformation;

setting criteria data;

comparing the blocking frequency analysis result with the criteria data to generate at least one comparison result, wherein the step of comparing the blocking frequency analysis result with the criteria data comprises:

comparing a peak frequency of the blocking frequency analysis result with the criteria data to generate a first comparison result; and comparing a broad band amplitude of the blocking frequency analysis result with the criteria data to generate a second comparison result; and the pass analysis report is generated when the first comparison result and the second comparison result are passed;

generating a pass analysis report when each one comparison result is passed; otherwise, executing an EMI design time-frequency analysis.

11. The non-transitory machine-readable medium of claim 10, wherein the step of executing the EMI design time-frequency analysis comprises:

determining if a broad band issue occurs in the IC system according to the first and second comparison results.

12. The non-transitory machine-readable medium of claim 11, wherein the step of determining if the broad band issue occurs in the IC system according to the first and second comparison results comprises:

when the broad band issue has not occurred in the IC system, determining if a peak issue occurs in the IC system according to the first and second comparison results; and when the broad band issue has occurred in the IC system, performing a time-frequency data analysis step for integrating the first and second comparison results and time-domain simulation waveforms of the IC system to generate integrated simulation data, and referring to the integrated simulation data to execute a time-frequency data analysis for generating a design time analysis result.

13. The non-transitory machine-readable medium of claim 12, wherein the step of determining if the peak issue occurs in the IC system according to the first and second comparison results comprises:

when the peak issue has occurred in the IC system, checking if a specific frequency issue occurs in the IC system, and performing the time-frequency data analysis step; and when the peak issue has not occurred in the IC system, performing the time-frequency data analysis step.

14. The non-transitory machine-readable medium of claim 10, wherein the step of executing the EMI design time-frequency analysis comprises:

integrating the first and second comparison results and time-domain simulation waveforms of the IC system to generate integrated simulation data, and referring to the integrated simulation data to execute a time-frequency data analysis for generating a design time analysis result.

15. The non-transitory machine-readable medium of claim 14, wherein the step of referring to the integrated simulation data to execute the time-frequency data analysis comprises:

generating merged simulation data according to the integrated simulation data and the transformed raw data of the IC system;

comparing the first and second comparison results to determine a specific frequency;

checking an occurrence time range of the specific frequency according to the merged simulation data and recording it in the design time analysis result; and determining if the EMI characteristics are identified in the design time analysis result.

16. The non-transitory machine-readable medium of claim 10, wherein the instructions, when executed by the processor, cause the processor to further perform the following steps:

when printed circuit board (PCB) signal integrity/power integrity (SI/PI) frequency analysis data of the IC system are not available, keeping the blocking frequency analysis result intact; and when the PCB SI/PI frequency analysis data of the IC system are available, selectively adjusting the blocking frequency analysis result according to the PCB SI/PI frequency analysis data of the IC system.

17. The non-transitory machine-readable medium of claim 16, wherein the step of selectively adjusting the blocking frequency analysis result comprises:

transforming the PCB SI/PI frequency analysis data into transformed SI/PI data;

selecting the frequency domain range of the transformed SI/PI data to generate blocking transformed SI/PI data;

mixing the blocking transformed SI/PI data and the blocking frequency analysis result to generate a new blocking frequency analysis result; and selectively replacing the blocking frequency analysis result according to the new blocking frequency analysis result.

18. The non-transitory machine-readable medium of claim 10, wherein the step of setting the criteria data comprises:

transforming a history EMI data to build up the criteria data when the history EMI data of the IC system are available; otherwise, utilizing a user-defined criteria data.

19. A method for predicting and debugging electromagnetic interference (EMI) characteristics of an integrated circuit (IC) system, comprising:

selecting a frequency domain range for a processing unit according to transformed raw data of the IC system to generate a blocking frequency analysis result, wherein the transformed raw data are transformed by a time-frequency waveform transformation;

setting criteria data to the processing unit;

utilizing the processing unit to compare the blocking frequency analysis result with the criteria data to generate at least one comparison result; and utilizing the processing unit to generate a pass analysis report when the processing unit determines that each comparison result is passed; otherwise, utilizing the processing unit to execute an EMI design time-frequency analysis;

when printed circuit board (PCB) signal integrity/power integrity (SI/PI) frequency analysis data of the IC system are not available, keeping the blocking frequency analysis result intact; and when the PCB SI/PI frequency analysis data of the IC system are available, selectively adjusting the blocking frequency analysis result according to the PCB SI/PI frequency analysis data of the IC system.

20. The method of claim 19, wherein the step of selectively adjusting the blocking frequency analysis result comprises:

transforming the PCB SI/PI frequency analysis data into transformed SI/PI data;

selecting the frequency domain range of the transformed SI/PI data to generate blocking transformed SI/PI data;

mixing the blocking transformed SI/PI data and the blocking frequency analysis result to generate a new blocking frequency analysis result; and selectively replacing the blocking frequency analysis result according to the new blocking frequency analysis result.

21. A non-transitory machine-readable medium storing instructions which, when executed by a processor, cause the processor to perform:

selecting a frequency domain range according to transformed raw data of the IC system to generate a blocking frequency analysis result, wherein the transformed raw data are transformed by a time-frequency waveform transformation;

setting criteria data;

comparing the blocking frequency analysis result with the criteria data to generate at least one comparison result;

generating a pass analysis report when each one comparison result is passed; otherwise, executing an EMI design time-frequency analysis;

wherein the instructions, when executed by the processor, cause the processor to further perform the following steps:

when printed circuit board (PCB) signal integrity/power integrity (SI/PI) frequency analysis data of the IC system are not available, keeping the blocking frequency analysis result intact; and when the PCB SI/PI frequency analysis data of the IC system are available, selectively adjusting the blocking frequency analysis result according to the PCB SI/PI frequency analysis data of the IC system.

22. The non-transitory machine-readable medium of claim 21, wherein the step of selectively adjusting the blocking frequency analysis result comprises:

transforming the PCB SI/PI frequency analysis data into transformed SI/PI data;

selecting the frequency domain range of the transformed SI/PI data to generate blocking transformed SI/PI data;

mixing the blocking transformed SI/PI data and the blocking frequency analysis result to generate a new blocking frequency analysis result; and selectively replacing the blocking frequency analysis result according to the new blocking frequency analysis result.

* * * * *